United States Patent
Senoo et al.

(10) Patent No.: US 9,871,221 B2
(45) Date of Patent: Jan. 16, 2018

(54) ELECTROLUMINESCENT DEVICE HAVING HOLES FOR LIQUID FILLER FLOW

(71) Applicant: Sharp Kabushiki Kaisha, Sakai, Osaka (JP)

(72) Inventors: Tohru Senoo, Sakai (JP); Tetsuya Okamoto, Sakai (JP); Tohru Sonoda, Sakai (JP); Seiji Fujiwara, Sakai (JP); Takeshi Hirase, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/323,118

(22) PCT Filed: Jun. 30, 2015

(86) PCT No.: PCT/JP2015/068764
§ 371 (c)(1),
(2) Date: Dec. 30, 2016

(87) PCT Pub. No.: WO2016/002746
PCT Pub. Date: Jan. 7, 2016

(65) Prior Publication Data
US 2017/0133626 A1    May 11, 2017

(30) Foreign Application Priority Data
Jun. 30, 2014 (JP) .................. 2014-135306

(51) Int. Cl.
*H01L 51/52* (2006.01)
(52) U.S. Cl.
CPC ...... *H01L 51/5246* (2013.01); *H01L 51/5203* (2013.01); *H01L 51/5237* (2013.01)

(58) Field of Classification Search
CPC ............ H01L 51/5246; H01L 51/5203; H01L 51/5237
See application file for complete search history.

(56) References Cited

U.S. PATENT DOCUMENTS

| 5,757,451 A * | 5/1998 | Miyazaki ............ G02F 1/13394 349/106 |
| 6,924,594 B2 * | 8/2005 | Ogura .................... H05B 33/04 313/506 |

(Continued)

FOREIGN PATENT DOCUMENTS

| JP | 2003-297557 A | 10/2003 |
| JP | 2005-005166 A | 1/2005 |

(Continued)

OTHER PUBLICATIONS

Official Communication issued in International Patent Application No. PCT/JP2015/068764, dated Sep. 29, 2015.

*Primary Examiner* — Ida M Soward
(74) *Attorney, Agent, or Firm* — Keating & Bennett, LLP

(57) ABSTRACT

The present invention includes a frame-shaped sealing material, a filling layer, and a support. The frame-shaped sealing material is provided between a TFT substrate and a counter substrate, and is configured to seal an organic EL element (electroluminescent element) along with the TFT substrate and the counter substrate. The filling layer is composed of a liquid filler, and is filled in the space between the counter substrate, a sealing film, and the sealing material. The support is located inside the sealing material and between the TFT substrate and the counter substrate, and also supports the TFT substrate and the counter substrate.

8 Claims, 9 Drawing Sheets

(56) References Cited

U.S. PATENT DOCUMENTS

| | | | | |
|---|---|---|---|---|
| 7,196,465 | B2* | 3/2007 | Park | H01L 27/3253 257/E27.12 |
| 7,446,472 | B2* | 11/2008 | Matsukaze | H01L 27/322 313/112 |
| 8,822,982 | B2* | 9/2014 | Yamazaki | H01L 21/6835 257/40 |
| 8,907,367 | B2* | 12/2014 | Hayashi | H05B 33/26 257/680 |
| 8,988,646 | B2* | 3/2015 | Eun | G02F 1/1303 349/153 |
| 9,105,523 | B2* | 8/2015 | Kadono | H01L 27/1214 |
| 9,263,697 | B2* | 2/2016 | Yamazaki | H01L 27/32 |
| 9,625,764 | B2* | 4/2017 | Yamazaki | G02F 1/1339 |
| 2006/0203168 | A1* | 9/2006 | Ishitani | G02F 1/1339 349/139 |
| 2011/0081747 | A1* | 4/2011 | Yoshitomi | H01L 27/1225 438/104 |
| 2013/0003003 | A1* | 1/2013 | Nishi | G02F 1/0045 349/123 |
| 2013/0049184 | A1 | 2/2013 | Kasahara et al. | |
| 2015/0076689 | A1* | 3/2015 | Huang | H01L 24/13 257/737 |
| 2015/0090991 | A1 | 4/2015 | Ishii et al. | |

FOREIGN PATENT DOCUMENTS

| | | |
|---|---|---|
| JP | 2008-235089 A | 10/2008 |
| JP | 2011-053339 A | 3/2011 |
| JP | 2011-187273 A | 9/2011 |
| JP | 2015-069861 A | 4/2015 |

* cited by examiner

ELECTROLUMINESCENT DEVICE HAVING HOLES FOR LIQUID FILLER FLOW

TECHNICAL FIELD

The present invention relates an electroluminescent device including an EL (electroluminescent) element.

BACKGROUND ART

In recent years, flat panel displays have been widely used in various commodities and fields, and the flat panel displays are required to have a larger size, a higher image quality, and a lower power consumption.

Under these circumstances, an organic EL display device is attracting considerable attention as an all-solid-state flat panel display with excellent low-voltage driving capability, high-speed responsibility, and self-luminous property. The organic EL display device includes an organic EL element that utilizes the electroluminescence of an organic material.

In an active matrix type organic EL display device, e.g., a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above organic EL display device, it has been proposed that a sealing film is formed on the organic EL element, and the organic EL element is sealed by the sealing film to prevent the degradation of the organic EL element due to moisture or oxygen.

In the above conventional organic EL display device, it also has been proposed that a sealing member (counter substrate) is located opposite the substrate, an adhesive (sealing material) in the form of a frame is provided to surround the organic EL element between the substrate and the sealing member, and the organic EL element is sealed by the substrate, the sealing member, and the adhesive (see, e.g., Patent Document 1). In this conventional organic EL display device, a drying agent (filler) is filled in the inside of the space surrounded by the substrate, the sealing member, and the adhesive, which can make it difficult for moisture to enter the organic EL element from the outside.

PRIOR ART DOCUMENTS

Patent Documents

Patent Document 1: JP 2003-297557 A

DISCLOSURE OF INVENTION

Problem to be Solved by the Invention

However, in the above conventional organic EL display device, the drying agent (filler) may not be uniformly filled in the inside of the space surrounded by the substrate, the sealing member (counter substrate), and the adhesive (sealing material). This results in low reliability of the device.

Specifically, in the conventional organic EL display device, the drying agent is applied to one of the substrate and the sealing member, and then the substrate and the sealing member are bonded together with the adhesive in a vacuum atmosphere. During the vacuum bonding, the substrate and the sealing member are uniformly pressed against each other at high pressure, so that the drying agent is pushed away from the adhesive located around the periphery toward the center. Therefore, a gap between the substrate and the sealing member, particularly the gap in the vicinity of the adhesive, may be reduced depending on, e.g., the materials and the thicknesses of the substrate and the sealing member, the material and the thickness of the adhesive, the material of the drying agent, or the manufacturing conditions of vacuum bonding. Thus, in the conventional organic EL display device, the drying agent does not extend to the vicinity of the adhesive, and may not be uniformly filled in the inside of the space surrounded by the substrate, the sealing member, and the adhesive. Consequently, the conventional organic EL display device has a problem of low reliability.

With the foregoing in mind, it is an object of the present invention to provide an electroluminescent device that has high reliability and allows a filler to be uniformly filled in the space between a substrate and a counter substrate even when the substrate and the counter substrate are bonded together.

Means for Solving Problem

To achieve the above object, an electroluminescent device of the present invention includes a substrate and an electroluminescent element provided on the substrate. The electroluminescent device includes the following: a counter substrate that is located opposite the substrate; a sealing film that seals the electroluminescent element; a frame-shaped sealing material that is provided between the substrate and the counter substrate, and that is configured to seal the electroluminescent element along with the substrate and the counter substrate; and a filling layer that is composed of a liquid filler, and that is filled in a space between the counter substrate, the sealing film, and the sealing material. A support is located inside the sealing material and between the substrate and the counter substrate so as to leave holes through which the filler can flow, and also supports the substrate and the counter substrate.

In the electroluminescent device having the above configuration, the support is located inside the sealing material and between the substrate and the counter substrate so as to leave holes through which the filler can flow. The support also supports the substrate and the counter substrate. This configuration can prevent the gap between the substrate and the counter substrate from becoming smaller even when the substrate and the counter substrate are bonded together. Consequently, unlike the conventional example, the filler can be uniformly filled in the space between the substrate and the counter substrate even when the substrate and the counter substrate are bonded together. Therefore, the electroluminescent device can have high reliability.

In the electroluminescent device, the support may include a plurality of support members that are arranged parallel to a side of the frame-shaped sealing material.

In this case, since the support members are arranged parallel to a side of the sealing material, the gap between the substrate and the counter substrate can be prevented from becoming smaller even when the substrate and the counter substrate are bonded together.

In the electroluminescent device, it is preferable that the support includes a plurality of support members that are arranged perpendicular to a side of the frame-shaped sealing material.

In this case, since the support members are arranged perpendicular to a side of the sealing material, the gap between the substrate and the counter substrate can be prevented from becoming smaller even when the substrate and the counter substrate are bonded together. Moreover, since the support members are arranged perpendicular to a side of the sealing material, the filler can easily extend to the vicinity of the sealing material.

In the electroluminescent device, the support may include a plurality of support members that are arranged only along long sides of four sides of the frame-shaped sealing material.

In this case, no support member is provided on the short sides of the sealing material, where it is relatively easy for the filler to spread, and the support members are provided only on the long sides of the sealing material, where it is relatively difficult for the filler to spread. Therefore, the filler can be uniformly filled in the space between the substrate and the counter substrate, while the number of parts is reduced. Consequently, the electroluminescent device with high reliability can be easily provided.

In the electroluminescent device, it is preferable that the support is configured such that a size of a support member located in an end portion of a side of the framed-shaped sealing material is larger than that of a support member located in a central portion of the side of the frame-shaped sealing material.

In this case, the size of the support member located in the end portion of a side of the sealing material is larger than that of the support member located in the central portion of the side of the sealing material. Therefore, the filler can easily spread to each of the end portions of the sides of the sealing material, where it is relatively difficult for the filler to spread.

In the electroluminescent device, the support may include a plurality of support members that are alternately arranged along a side of the frame-shaped sealing material.

In this case, since the support members are alternately arranged along a side of the sealing material, the filler can easily spread, while the strength of supporting the substrate and the counter substrate is ensured.

In the electroluminescent device, it is preferable that the electroluminescent element includes a first electrode provided on the substrate and a second electrode provided on the counter substrate, and that the second electrode is a reflecting electrode and light from the electroluminescent element is emitted from the substrate to the outside.

In this case, the support can be located on an effective light emitting area of the electroluminescent element. Thus, it is easy to narrow the frame of the electroluminescent device.

In the electroluminescent device, it is preferable that the support is made of the same material as that of the sealing material.

In this case, the electroluminescent device with a reduced number of parts can be easily produced.

Effects of the Invention

The present invention can provide an electroluminescent device that has high reliability and allows a filler to be uniformly filled in the space between a substrate and a counter substrate even when the substrate and the counter substrate are bonded together.

BRIEF DESCRIPTION OF DRAWINGS

FIG. 4(*a*) is a cross-sectional view illustrating a state before a TFT substrate and a counter substrate are bonded together. FIG. 4(*b*) is a cross-sectional view illustrating a state after the TFT substrate and the counter substrate are bonded together.

FIG. 5(*a*) is a cross-sectional view illustrating a state before a TFT substrate and a counter substrate are bonded together. FIG. 5(*b*) is a cross-sectional view illustrating a state after the TFT substrate and the counter substrate are bonded together.

DESCRIPTION OF THE INVENTION

Figure 1:
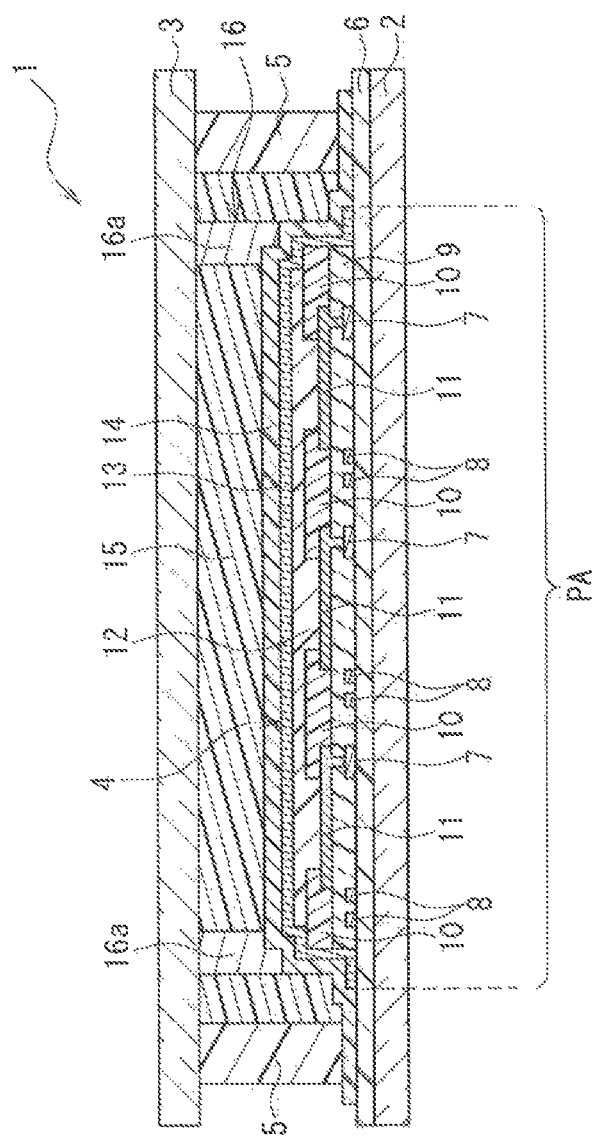
FIG. 1 is a cross-sectional view illustrating a cross section of an organic EL display device of Embodiment 1 of the present invention.

Hereinafter, preferred embodiments of an electroluminescent device of the present invention will be described with reference to the drawings. In the following description, the present invention is applied to an organic EL display device. The size and size ratio of each of the constituent members in the drawings may not exactly represent those of the actual constituent members.

Embodiment 1

Figure 2:
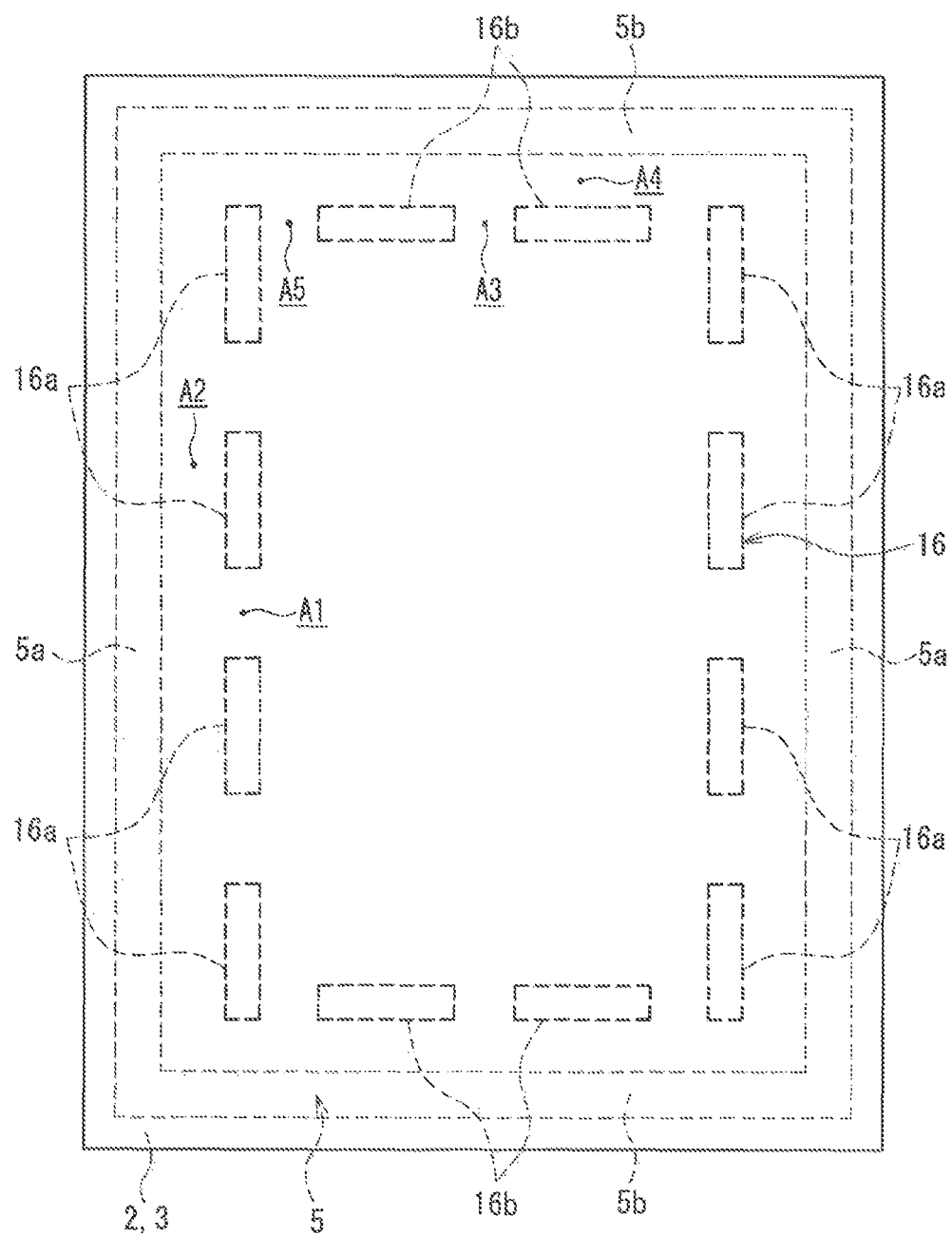
FIG. 2 is a plan view illustrating the main configuration of the organic EL display device.

FIG. 1 is a cross-sectional view illustrating a cross section of an organic EL display device of Embodiment 1 of the present invention. FIG. 2 is a plan view illustrating the main configuration of the organic EL display device. In FIG. 1, an organic EL display device 1 of this embodiment includes a TFT substrate (substrate) 2 and an organic EL element (electroluminescent element) 4 provided on the TFT substrate 2. The organic EL element 4 is sealed by the TFT substrate 2, a counter substrate 3, and a frame-shaped sealing material 5. The counter substrate 3 is located on the opposite side of the organic EL element 4 from the TFT substrate 2. The frame-shaped sealing material 5 is provided between the TFT substrate 2 and the counter substrate 3.

In the organic EL display device 1 of this embodiment, the organic EL element 4 forms a rectangular pixel area PA having a plurality of pixels (including a plurality of subpixels), and the organic EL element 4 is sealed by a sealing film 14. The pixel area PA is a display portion of the organic EL display device 1 and displays information. In the pixel area PA, the pixels (subpixels) are arranged in a matrix, and the organic EL element 4 emits light for each subpixel so that information is displayed. The subpixels may be, e.g., RGB subpixels with different colors of red (R), green (G), and blue (B).

In FIG. 1, the TFT substrate 2 and the counter substrate 3 are made of e.g., a glass material or a film having flexibility. An underlying film (insulating film) 6 is formed on the TFT substrate 2 to cover the entire surface of the TFT substrate 2. As illustrated in FIG. 1, in the organic EL display device 1, TFTs (thin-film transistors) 7 are provided on the underlying film 6 so as to correspond to each subpixel in the pixel area PA. Moreover, lines 8 are formed on the underlying film 6. The lines 8 include a plurality of source lines (signal lines) and a plurality of gate lines that are arranged in a matrix. The source lines are connected to a source driver (not shown) and the gate lines are connected to a gate driver (not shown). With this configuration, the TFTs 7 are driven on a subpixel-by-subpixel basis in accordance with an external input image signal. The TFTs 7 function as switching elements that control the light emission of the corresponding subpixels. Thus, the TFTs 7 control the light emission of any of red (R), green (G), and blue (B) subpixels of the organic EL element 4.

The underlying film 6 serves to prevent the properties of the TFTs 7 from being reduced due to the diffusion of impurities from the TFT substrate 2 to the TFTs 7. If there is no concern for such a reduction in the properties of the TFTs 7, then the formation of the underlying film 6 may be omitted.

When the TFT substrate 2 is a film having flexibility, a moisture barrier that is an inorganic film such as silicon nitride or silicon oxynitride may be previously formed on the TFT substrate 2 in order to prevent the degradation of the TFTs 7 and the organic EL element 4 due to moisture or oxygen that has permeated (entered) from the outside.

As illustrated in FIG. 1, an interlayer insulating film 9, an edge cover 10, and a first electrode 11 of the organic EL element 4 are formed on the TFT substrate 2. The interlayer insulating film 9 functions as a planarization film and is formed on the underlying film 6 to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (as will be described later). Moreover, the first electrode 11 is connected to the TFTs 7 via contact holes provided in the interlayer insulating film 9.

The edge cover 10 has openings, through which the first electrode 11 is exposed, and these portions substantially form the light emitting areas of the organic EL element 4. As described above, the organic EL display device 1 of this embodiment is configured to perform full-color display by emitting light of any color of RGB. The organic EL display device 1 of this embodiment is an active matrix type display device with the TFTs (thin-film transistors) 7.

As illustrated in FIG. 1, an organic EL layer 12 and the second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not shown) are formed in this order on the first electrode 11 as the organic EL layer 12, on top of which the second electrode (negative electrode) 13 is formed. Other than the above description, a single layer may have two or more functions such as a hole injection and transport layer. Moreover, a carrier blocking layer or the like may be appropriately inserted into the organic EL layer 12.

On the other hand, when the second electrode 13 is a positive electrode, the order in which the layers are stacked as the organic EL layer 12 is reversed.

The organic EL display device 1 is configured as a bottom emission type device. In this embodiment, the first electrode 11 is a permeable electrode or a semi-permeable electrode, and the second electrode 13 is a reflecting electrode. Accordingly, the organic EL display device 1 is a bottom emission type device that emits light from the TFT substrate 2. Since the organic EL display device 1 is a bottom emission type device, even if a support member (as will be described later) is provided on the counter substrate 3, it is easy to narrow the frame of the organic EL display device 1, and it is also possible to prevent a reduction in display quality.

In the organic EL display device 1 of this embodiment, the organic EL element 4 is sealed by the sealing film 14, as described above. The sealing film 14 prevents moisture or oxygen from permeating (entering) the organic EL element 4 from the outside, and thus prevents the degradation of the organic EL element 4.

The sealing film 14 is made of, e.g., an inorganic film such as silicon nitride, silicon oxide, silicon oxynitride, or aluminum oxide, or an organic film such as silicon oxycarbide, acrylate, polyurea, parylene, polyimide, or polyamide. Alternatively, the sealing film 14 may have a laminated structure of the inorganic film and the organic film.

In the organic EL display device 1 of this embodiment, the organic EL element 4 is sealed by the TFT substrate 2, the counter substrate 3, and the sealing material 5, as described above. The sealing material 5 is formed of a resin in which a spacer and inorganic particles are dispersed. The resin may be, e.g., an acrylic resin, a polyimide resin, an epoxy resin, or a phenol resin. The spacer is used to define a cell gap between the TFT substrate 2 and the counter substrate 3. As illustrated in FIG. 2, the sealing material 5 is formed around the pixel area PA (FIG. 1) in the form of a frame. Due to the dispersion of the inorganic particles, the moisture permeability of the sealing material 5 can be reduced further.

The organic EL display device 1 includes a filling layer 15 that is placed in a space between the counter substrate 3, the sealing material 5, and the sealing film 14. The filling layer 15 is composed of a liquid filler. Specifically, the filler is a liquid having a viscosity (e.g., 0.5 to 10 pa·c). More specifically, the filler is obtained by dispersing particles having a hygroscopic function in a resin. The hygroscopic particles may be, e.g., particles of metal oxide or activated carbon such as aluminum hydroxide or calcium oxide. In other words, the filling layer 15 also functions as a desiccant layer that absorbs moisture that has entered through the sealing material 5.

As will be described in detail later, the filling layer 15 is filled in such a manner that the filler is applied to, e.g., the surface of the counter substrate 3, and then spreads over the space between the counter substrate 3, the sealing material 5, and the sealing film 14 when the counter substrate 3 and the TFT substrate 2 are bonded together.

Moreover, the organic EL display device 1 includes a support 16. The support 16 is located inside the sealing material 5 and between the TFT substrate 2 and the counter substrate 3 so as to leave holes through which the filler can flow. The support 16 is configured to support the TFT substrate 2 and the counter substrate 3.

Specifically, as illustrated in FIG. 2, the support 16 includes a plurality of e.g., four support members 16a that are arranged parallel to each of two long sides 5a of the frame-shaped sealing material 5, and a plurality of e.g., two support members 16b that are arranged parallel to each of two short sides 5b of the frame-shaped sealing material 5.

The support members 16a, 16b of the support 16 are made of the same material as that of, e.g., the sealing material 5.

In the support 16, there is an aperture A1 (i.e., one of the holes) between two adjacent support members 16a, and there is an aperture A2 (i.e., one of the holes) between the support members 16a and a long side 5a of the sealing material 5. Moreover, there is an aperture A3 (i.e., one of the holes) between two adjacent support members 16b, and there is an aperture A4 (i.e., one of the holes) between the support members 16b and a short side 5b of the sealing material 5. Further, there is an aperture A5 (i.e., one of the holes) between the adjacent support members 16a and 16b.

Next, referring to FIGS. 3 to 5, the support 16 of this embodiment and its effect will be described in detail.

Figure 3:
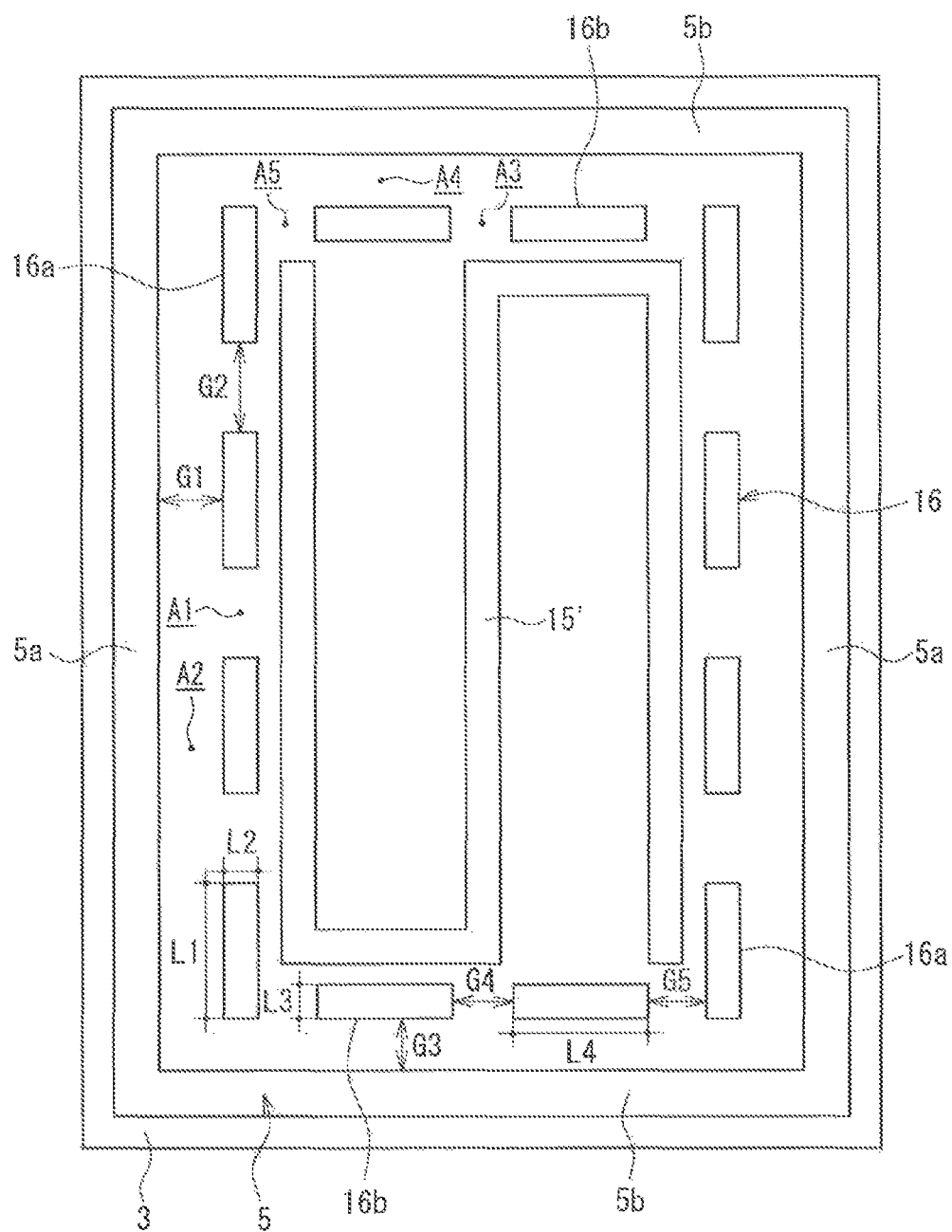
FIG. 3 is a plan view illustrating a sealing material, a filler, and a support that are provided on a counter substrate of the organic EL display device.
Figure 4A:
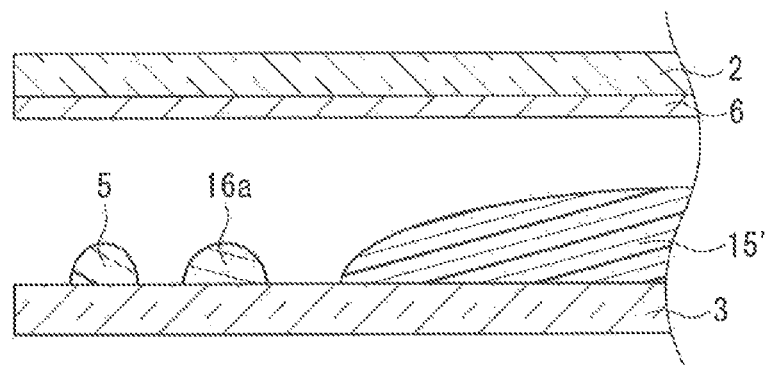
FIG. 4 is a diagram for explaining the effect of the support.
Figure 4B:
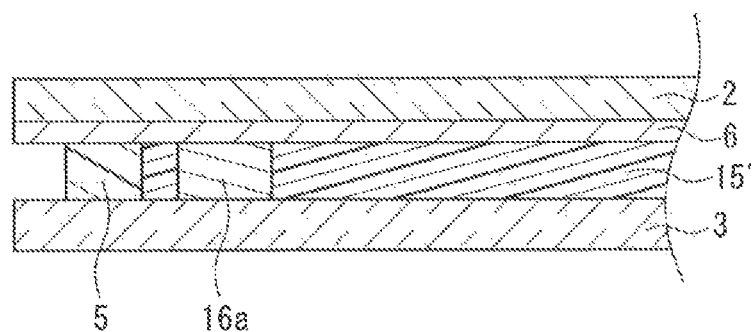
Figure 5A:
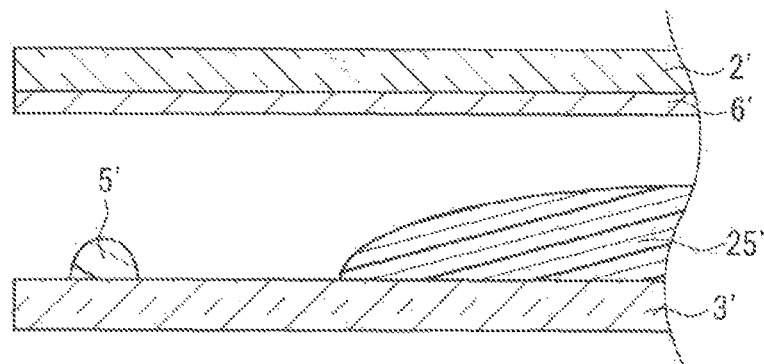
FIG. 5 is a diagram for explaining some problems in a comparative example.
Figure 5B:
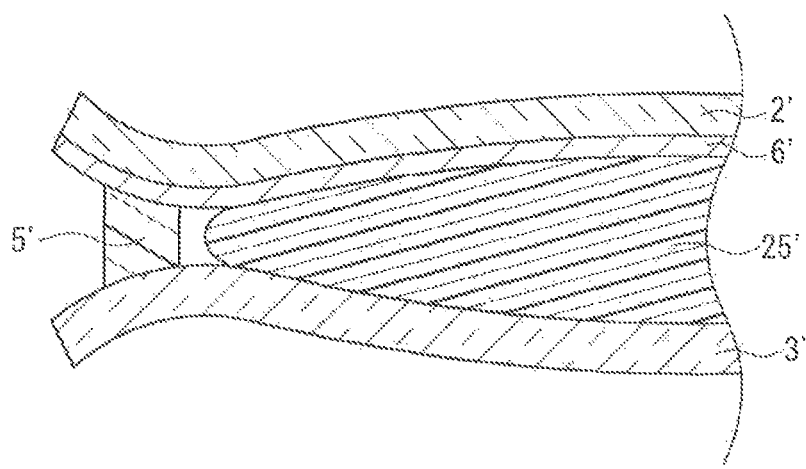

FIG. 3 is a plan view illustrating the sealing material, the filler, and the support that are provided on the counter substrate of the organic EL display device. FIG. 4 is a diagram for explaining the effect of the support. FIG. 4(a) is a cross-sectional view illustrating a state before the TFT substrate and the counter substrate are bonded together. FIG. 4(b) is a cross-sectional view illustrating a state after the TFT substrate and the counter substrate are bonded together. FIG. 5 is a diagram for explaining some problems in a comparative example. FIG. 5(a) is a cross-sectional view illustrating a state before a TFT substrate and a counter substrate are bonded together. FIG. 5(b) is a cross-sectional view illustrating a state after the TFT substrate and the counter substrate are bonded together.

In FIG. 3, the sealing material 5 is applied to the surface of the counter substrate 3 to form a frame by using, e.g., a nozzle dispenser. Moreover, the support members 16a, 16b are applied to the surface of the counter substrate 3 to be inside the sealing material 5 by using, e.g., a nozzle dispenser. The support members 16a, 16b are formed so that some of them are located on the pixel area PA, as illustrated in FIG. 1. This prevents the organic EL display device 1 from being unnecessarily large. Further, a filler 15' is applied dropwise to the surface of the counter substrate 3 in patterns as illustrated in FIG. 3 by using, e.g., a liquid crystal dropping method.

The length (represented by "L1" in FIG. 3) of the support member 16a in the direction parallel to the long side 5a is set to, e.g., about 6 mm, and the length (represented by "L2" in FIG. 3) of the support member 16a in the direction perpendicular to the long side 5a is set to, e.g., 2 mm or less. The length (represented by "L3" in FIG. 3) of the support member 16b in the direction perpendicular to the short side 5b is set to, e.g., 2 mm or less, and the length (represented by "L4" in FIG. 3) of the support member 16b in the direction parallel to the short side 5b is set to, e.g., about 6 mm.

In the support 16, the gap (represented by "G1" in FIG. 3) between the support members 16a and the long side 5a is set to, e.g., about 2 mm, and the gap (represented by "G2" in FIG. 3) between two adjacent support members 16a is set to, e.g., about 22 mm. Moreover, the gap (represented by "G3" in FIG. 3) between the support members 16b and the short side 5b is set to, e.g., about 2 mm, and the gap (represented by "G4" in FIG. 3) between two adjacent support members 16b is set to, e.g., about 22 mm. Further, the gap (represented by "G5" in FIG. 3) between the support members 16a and 16b is set to, e.g., about 22 mm.

As illustrated in FIG. 4(a), the sealing material 5, the support members 16a, and the filler 15' are applied to the surface of the counter substrate 3 before the TFT substrate 2 and the counter substrate 3 are bonded together. The TFT substrate 2 provided with the underlying film 6 is located opposite the counter substrate 3.

As illustrated in FIG. 4(b), a process of bonding the TFT substrate 2 and the counter substrate 3 is performed in a vacuum atmosphere. This process brings the sealing material 5 and the support members 16a on the counter substrate 3 into close contact with the TFT substrate 2. Thus, the TFT substrate 2 and the counter substrate 3 are supported by the support 16. In this manner, the support 16 can prevent the gap between the TFT substrate 2 and the counter substrate 3 from becoming smaller because the TFT substrate 2 and/or the counter substrate 3 is bent during the bonding process. The support 16 also allows the filler 15' to spread through the apertures A1 to A5 to the sealing material 5. Consequently, the filler 15' can be uniformly filled in the space between the TFT substrate 2 and the counter substrate 3.

On the other hand, the filler cannot be uniformly filled due to the absence of a support in the comparative example. As illustrated in FIG. 5(a), a sealing material 5' and a filler 25' are applied to the surface of a counter substrate 3'. A TFT substrate 2' provided with an underlying film 6' is located opposite the counter substrate 3'.

As illustrated in FIG. 5(b), a process of bonding the TFT substrate 2' and the counter substrate 3' is performed in a vacuum atmosphere. In this bonding process, since no support has been formed, the TFT substrate 2' and the counter substrate 3' are bent, so that the gap between the TFT substrate 2' and the counter substrate 3' becomes smaller, as illustrated in FIG. 5(b). Thus, in the comparative example, the filler 25' does not extend to the vicinity of the sealing material 5', and cannot be uniformly filled in the space between the TFT substrate 2' and the counter substrate 3'.

In the organic EL display device 1 of this embodiment having the above configuration, the support 16 is located inside the sealing material 5 and between the TFT substrate 2 and the counter substrate 3 so as to leave the apertures (holes) A1 to A5 through which the filler 15' can flow. The support 16 also supports the TFT substrate 2 and the counter substrate 3. This configuration can prevent the gap between the TFT substrate 2 and the counter substrate 3 from becoming smaller even when the TFT substrate 2 and the counter substrate 3 are bonded together, as illustrated in FIG. 4(b). Consequently, unlike the conventional example, the filler 15' can be uniformly filled in the space between the TFT substrate 2 and the counter substrate 3 even when the TFT substrate 2 and the counter substrate 3 are bonded together. Therefore, this embodiment can provide the organic EL display device (electroluminescent device) 1 with high reliability.

In this embodiment, the support 16 includes a plurality of support members 16a that are arranged parallel to each of the long sides 5a, and a plurality of support members 16b that are arranged parallel to each of the short sides 5b of the frame-shaped sealing material 5. Thus, this embodiment can prevent the gap between the TFT substrate 2 and the counter substrate 3 from becoming smaller even when the TFT substrate 2 and the counter substrate 3 are bonded together.

In this embodiment, the support 16 is made of the same material as that of the sealing material 5. Therefore, the organic EL display device 1 with a reduced number of parts can be easily produced.

Embodiment 2

Figure 6:
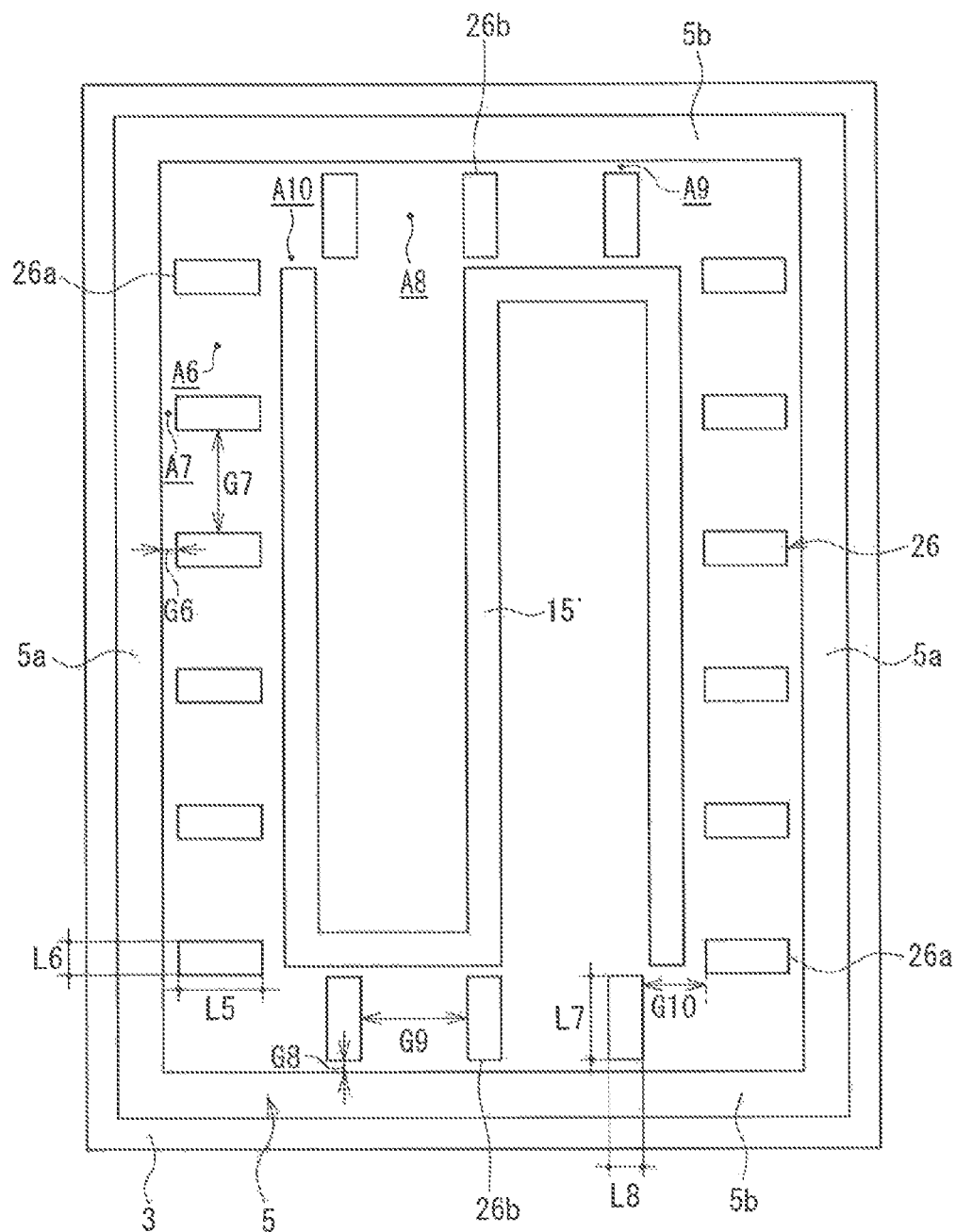
FIG. 6 is a plan view illustrating a sealing material, a filler, and a support that are provided on a counter substrate of an organic EL display device of Embodiment 2 of the present invention.

FIG. 6 is a plan view illustrating a sealing material, a filler, and a support that are provided on a counter substrate of an organic EL display device of Embodiment 2 of the present invention.

In FIG. 6, this embodiment mainly differs from Embodiment 1 in that a support includes a plurality of support members that are arranged perpendicular to each side of a frame-shaped sealing material. The same components as those of Embodiment 1 are denoted by the same reference numerals, and the explanation will not be repeated.

As illustrated in FIG. 6, an organic EL display device 1 of this embodiment includes a support 26 that is provided on a counter substrate 3 and located inside a frame-shaped sealing material 5. The support 26 includes a plurality of, e.g., six support members 26a that are arranged perpendicular to each of two long sides 5a of the frame-shaped sealing material 5, and a plurality of e.g., three support members 26b that are arranged perpendicular to each of two short sides 5b of the frame-shaped sealing material 5.

The support members 26a, 26b of the support 26 are made of the same material as that of, e.g., the sealing material 5.

In the support 26, there is an aperture A6 (i.e., one of the holes) between two adjacent support members 26a, and there is an aperture A7 (i.e., one of the holes) between the support members 26a and a long side 5a of the sealing material 5. Moreover, there is an aperture A8 (i.e., one of the holes) between two adjacent support members 26b, and there is an aperture A9 (i.e., one of the holes) between the support members 26b and a short side 5b of the sealing material 5. Further, there is an aperture A10 (i.e., one of the holes) between the adjacent support members 26a and 26b.

The length (represented by "L5" in FIG. 6) of the support member 26a in the direction perpendicular to the long side 5a is set to, e.g., about 6 mm, and the length (represented by "L6" in FIG. 6) of the support member 26a in the direction parallel to the long side 5a is set to, e.g., 2 mm or less. The length (represented by "L7" in FIG. 6) of the support member 26b in the direction perpendicular to the short side 5b is set to, e.g., about 6 mm, and the length (represented by "L8" in FIG. 6) of the support member 26b in the direction parallel to the short side 5b is set to, e.g., 2 mm or less.

In the support 26, the gap (represented by "G6" in FIG. 6) between the support members 26a and the long side 5a is set to, e.g., about 2 mm, and the gap (represented by "G7" in FIG. 6) between two adjacent support members 26a is set to, e.g., about 22 mm. Moreover, the gap (represented by "G8" in FIG. 6) between the support members 26b and the short side 5b is set to, e.g., about 2 mm, and the gap (represented by "G9" in FIG. 6) between two adjacent support members 26b is set to, e.g., about 22 mm. Further, the gap (represented by "G10" in FIG. 6) between the support members 26a and 26b is set to, e.g., about 22 mm.

With the above configuration, this embodiment can have the same effects as those of Embodiment 1. In this embodiment, the support 26 includes a plurality of support members 26a that are arranged perpendicular to each of the long sides 5a, and a plurality of support members 26b that are arranged perpendicular to each of the short sides 5b of the frame-shaped sealing material 5. Thus, this embodiment can prevent the gap between the TFT substrate 2 and the counter substrate 3 from becoming smaller even when the TFT substrate 2 and the counter substrate 3 are bonded together. Moreover, the support members 26a and 26b are arranged perpendicular to the long sides 5a and the short sides 5b of the sealing material 5, respectively. Therefore, the aperture A6 between two support members 26a and the aperture A8 between two support members 26b can each be adjusted to the optimum width, so that the filler 15' can easily extend to the vicinity of the sealing material 5.

Embodiment 3

Figure 7:
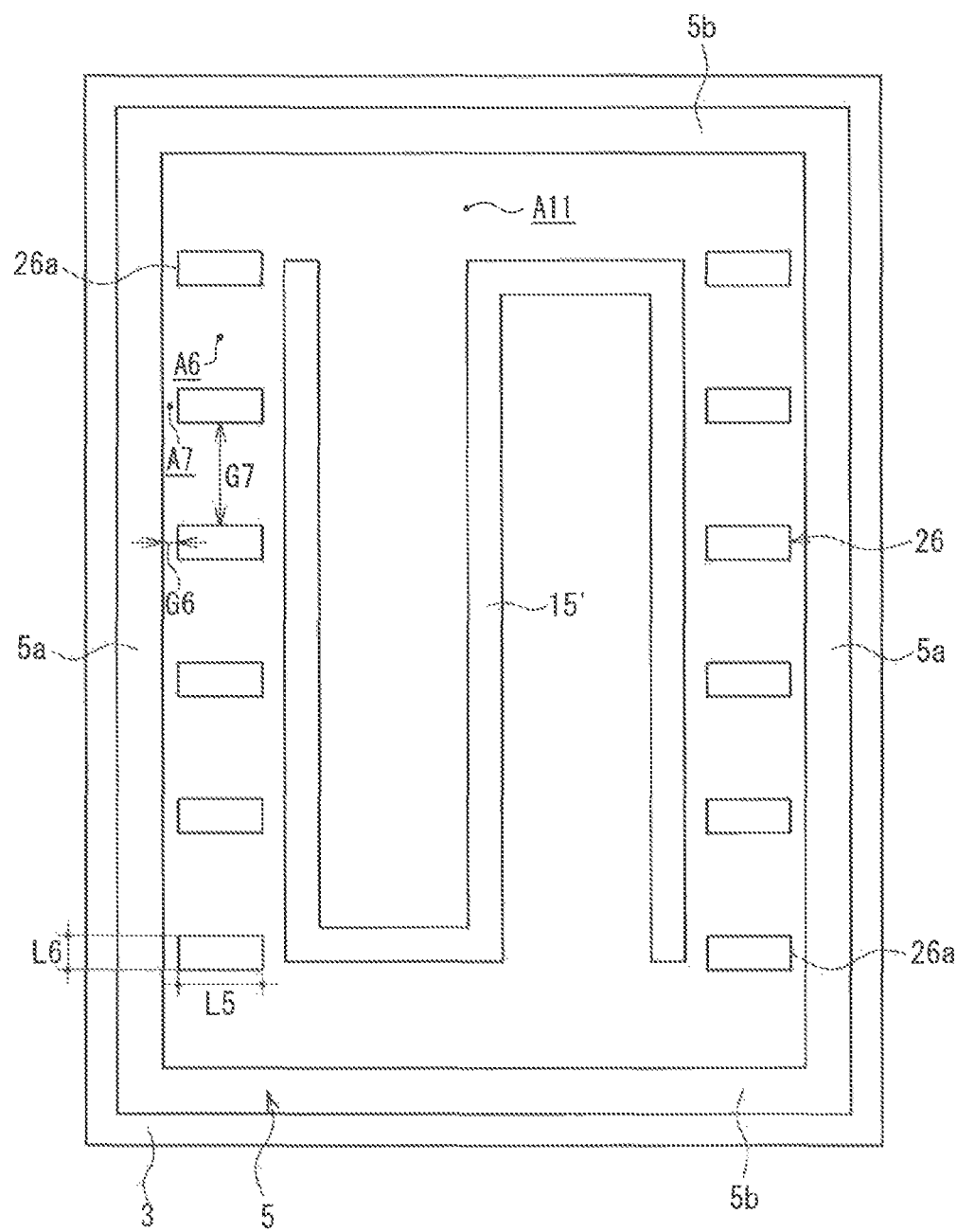
FIG. 7 is a plan view illustrating a sealing material, a filler, and a support that are provided on a counter substrate of an organic EL display device of Embodiment 3 of the present invention.

FIG. 7 is a plan view illustrating a sealing material, a filler, and a support that are provided on a counter substrate of an organic EL display device of Embodiment 3 of the present invention.

In FIG. 7, this embodiment mainly differs from Embodiment 2 in that a support includes a plurality of support members that are arranged only along the long sides of four sides of a frame-shaped sealing material. The same components as those of Embodiment 2 are denoted by the same reference numerals, and the explanation will not be repeated.

As illustrated in FIG. 7, an organic EL display device 1 of this embodiment includes a support 26 that is provided on a counter substrate 3 and located inside a frame-shaped sealing material 5. The support 26 includes a plurality of, e.g., six support members 26a that are arranged perpendicular to each of two long sides 5a of the frame-shaped sealing material 5.

In the organic EL display device 1 of this embodiment, unlike Embodiment 2, the support 26 includes no support member that is arranged perpendicular to each of two short sides 5b of the frame-shaped sealing material 5. There is an aperture A11 between the left and right support members 26a (FIG. 6) on each of the short sides 5b.

With the above configuration, this embodiment can have the same effects as those of Embodiment 2. In this embodiment, the support 26 includes a plurality of support members 26a that are arranged only along the long sides 5a of four sides of the frame-shaped sealing material 5. No support member is provided on the short sides 5b of the sealing material 5, where it is relatively easy for the filler 15' to spread. On the other hand, the support members 26a are provided only on the long sides 5a of the sealing material, where it is relatively difficult for the filler 15' to spread. Therefore, the filler 15' can be uniformly filled in the space between the TFT substrate 2 and the counter substrate 3, while the number of parts is reduced. Consequently, this embodiment can easily provide the organic EL display device 1 with high reliability.

Embodiment 4

Figure 8:
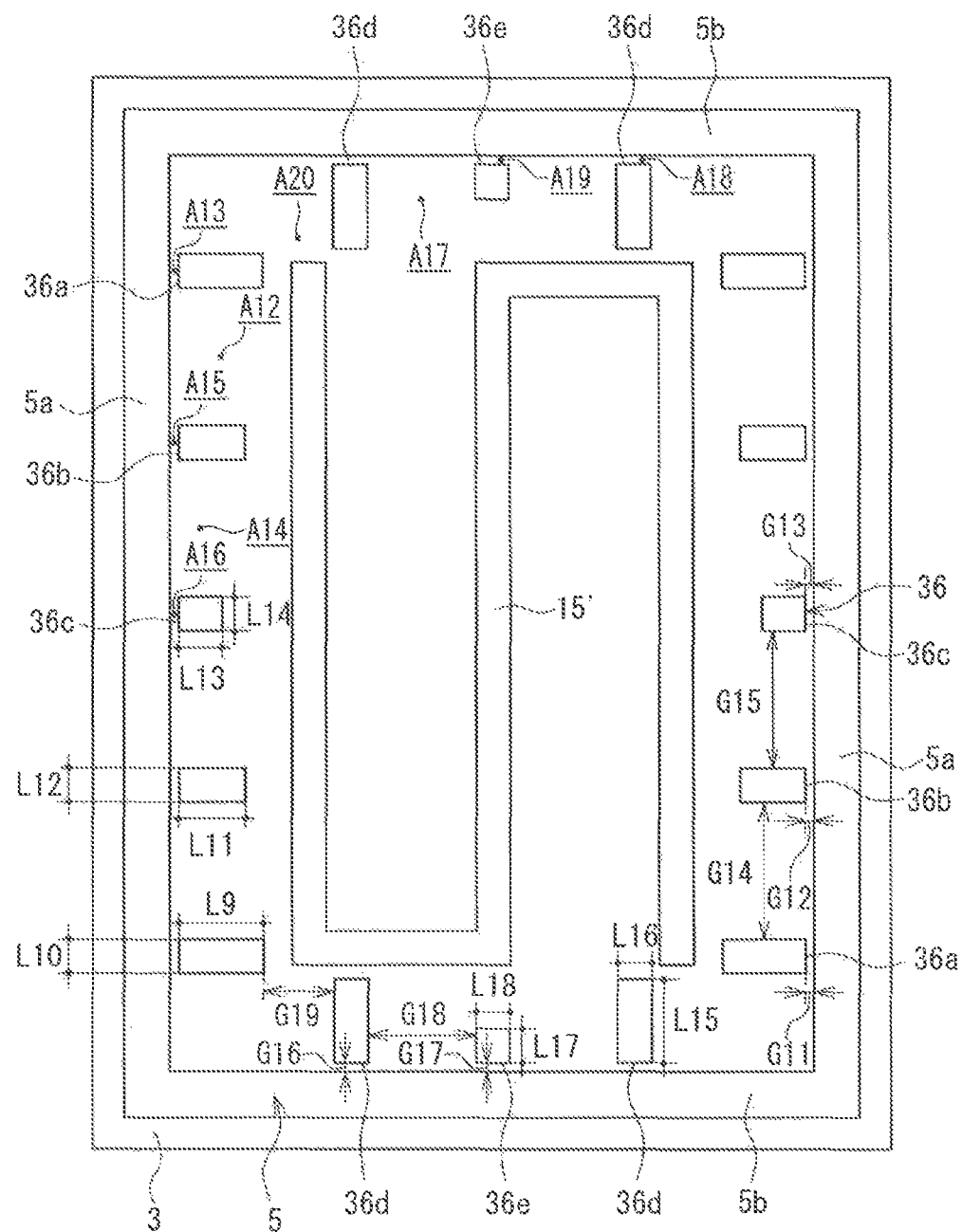
FIG. 8 is a plan view illustrating a sealing material, a filler, and a support that are provided on a counter substrate of an organic EL display device of Embodiment 4 of the present invention.

FIG. 8 is a plan view illustrating a sealing material, a filler, and a support that are provided on a counter substrate of an organic EL display device of Embodiment 4 of the present invention.

In FIG. 8, this embodiment mainly differs from Embodiment 1 in that a support includes a plurality of support members that are arranged on each side of a frame-shaped sealing material so that the size of a support member located in the end portion of a side of the sealing material is larger than that of a support member located in the central portion of the side of the sealing material. The same components as those of Embodiment 1 are denoted by the same reference numerals, and the explanation will not be repeated.

As illustrated in FIG. 8, an organic EL display device 1 of this embodiment includes a support 36 that is provided on a counter substrate 3 and located inside a frame-shaped sealing material 5. The support 36 includes a plurality of, e.g., two support members 36a, two support members 36b, and one support member 36c that are arranged perpendicular to each of two long sides 5a of the frame-shaped sealing material 5, and a plurality of, e.g., two support members 36d and one support member 36e that are arranged perpendicular to each of two short sides 5b of the frame-shaped sealing material 5.

Specifically, as illustrated in FIG. 8, the support members 36a, 36b, 36c, 36b, and 36a are provided in this order along a long side 5a of the sealing material 5. The support members 36a, 36b, and 36c are listed in descending order of size. In the support 36, the size of the support member 36a located in the end portion of the long side 5a of the sealing material 5 is larger than that of the support member 36c located in the central portion of the long side 5a of the sealing material 5.

Moreover, as illustrated in FIG. 8, the support members 36d, 36e, and 36d are provided in this order along a short side 5b of the sealing material 5. The support members 36d and 36e are listed in descending order of size. In the support 36, the size of the support member 36d located in the end portion of the short side 5b of the sealing material 5 is larger than that of the support member 36e located in the central portion of the short side 5b of the sealing material 5.

The support members 36a, 36b, 36c, 36d, and 36e of the support 36 are made of the same material as that of e.g., the sealing material 5.

In the support 36, there is an aperture A12 (i.e., one of the holes) between the adjacent support members 36a and 36b, and there is an aperture A13 (i.e., one of the holes) between the support member 36a and the long side 5a of the sealing material 5. Moreover, there is an aperture A14 (i.e., one of the holes) between the adjacent support members 36b and 36c, there is an aperture A15 (i.e., one of the holes) between the support member 36b and the long side 5a of the sealing material 5, and there is an aperture A16 (i.e., one of the holes) between the support member 36c and the long side 5a of the sealing material 5. Furthermore, there is an aperture A17 (i.e., one of the holes) between the support members 36d and 36e, there is an aperture A18 (i.e., one of the holes) between the support member 36d and the short side 5b of the sealing material 5, and there is an aperture A19 (i.e., one of the holes) between the support member 36e and the short side 5b of the sealing material 5. Further, there is an aperture A20 (i.e., one of the holes) between the adjacent support members 36a and 36d.

The length (represented by "L9" in FIG. 8) of the support member 36a in the direction perpendicular to the long side 5a is set to, e.g., about 6 mm, and the length (represented by "L10" in FIG. 8) of the support member 36a in the direction parallel to the long side 5a is set to, e.g., 2 mm or less. The length (represented by "L11" in FIG. 8) of the support member 36b in the direction perpendicular to the long side 5a is set to, e.g., about 5 mm, and the length (represented by "L12" in FIG. 8) of the support member 36b in the direction parallel to the long side 5a is set to, e.g., 2 mm or less. The length (represented by "L13" in FIG. 8) of the support member 36c in the direction perpendicular to the long side 5a is set to, e.g., about 4 mm, and the length (represented by "L14" in FIG. 8) of the support member 36c in the direction parallel to the long side 5a is set to, e.g., 2 mm or less.

The length (represented by "L15" in FIG. 8) of the support member 36d in the direction perpendicular to the short side 5b is set to, e.g., about 6 mm, and the length (represented by "L16" in FIG. 8) of the support member 36d in the direction parallel to the short side 5b is set to, e.g., 2 mm or less. The length (represented by "L17" in FIG. 8) of the support member 36e in the direction perpendicular to the short side 5b is set to, e.g., about 4 mm, and the length (represented by "L18" in FIG. 8) of the support member 36e in the direction parallel to the short side 5b is set to, e.g., 2 mm or less.

In the support 36, the gap (represented by "G11" in FIG. 8) between the support member 36a and the long side 5a is set to, e.g., about 2 mm, the gap (represented by "G12" in FIG. 8) between the support member 36b and the long side 5a is set to, e.g., about 2 mm, and the gap (represented by "G13" in FIG. 8) between the support member 36c and the long side 5a is set to, e.g., about 2 mm. Moreover, the gap (represented by "G14" in FIG. 8) between two adjacent support members 36a and 36b is set to, e.g., about 22 mm, and the gap (represented by "G15" in FIG. 8) between two adjacent support members 36b and 36c is set to, e.g., about 22 mm.

In the support 36, the gap (represented by "G18" in FIG. 8) between the support member 36d and the short side 5b is set to, e.g., about 2 mm, and the gap (represented by "G19" in FIG. 8) between the support member 36e and the short side 5b is set to, e.g., about 2 mm. Moreover, the gap (represented by "G17" in FIG. 8) between two adjacent support members 36d and 36e is set to, e.g., about 22 mm. Further, the gap (represented by "G20" in FIG. 8) between the support members 36a and 36d is set to, e.g., about 22 mm.

With the above configuration, this embodiment can have the same effects as those of Embodiment 1. In this embodiment, the support 36 is configured such that the size of the support member 36a located in the end portion of the long side 5a of the sealing material 5 is larger than that of the support member 36c located in the central portion of the long side 5a of the sealing material 5. Moreover, the support 36 is configured such that the size of the support member 36d located in the end portion of the short side 5b of the sealing material 5 is larger than that of the support member 36e located in the central portion of the short side 5b of the sealing material 5. Thus, in this embodiment, the filler 15' can easily spread to each of the end portions of the long sides 5a and the short sides 5b of the sealing material 5, where it is relatively difficult for the filler 15' to spread.

Embodiment 5

Figure 9:
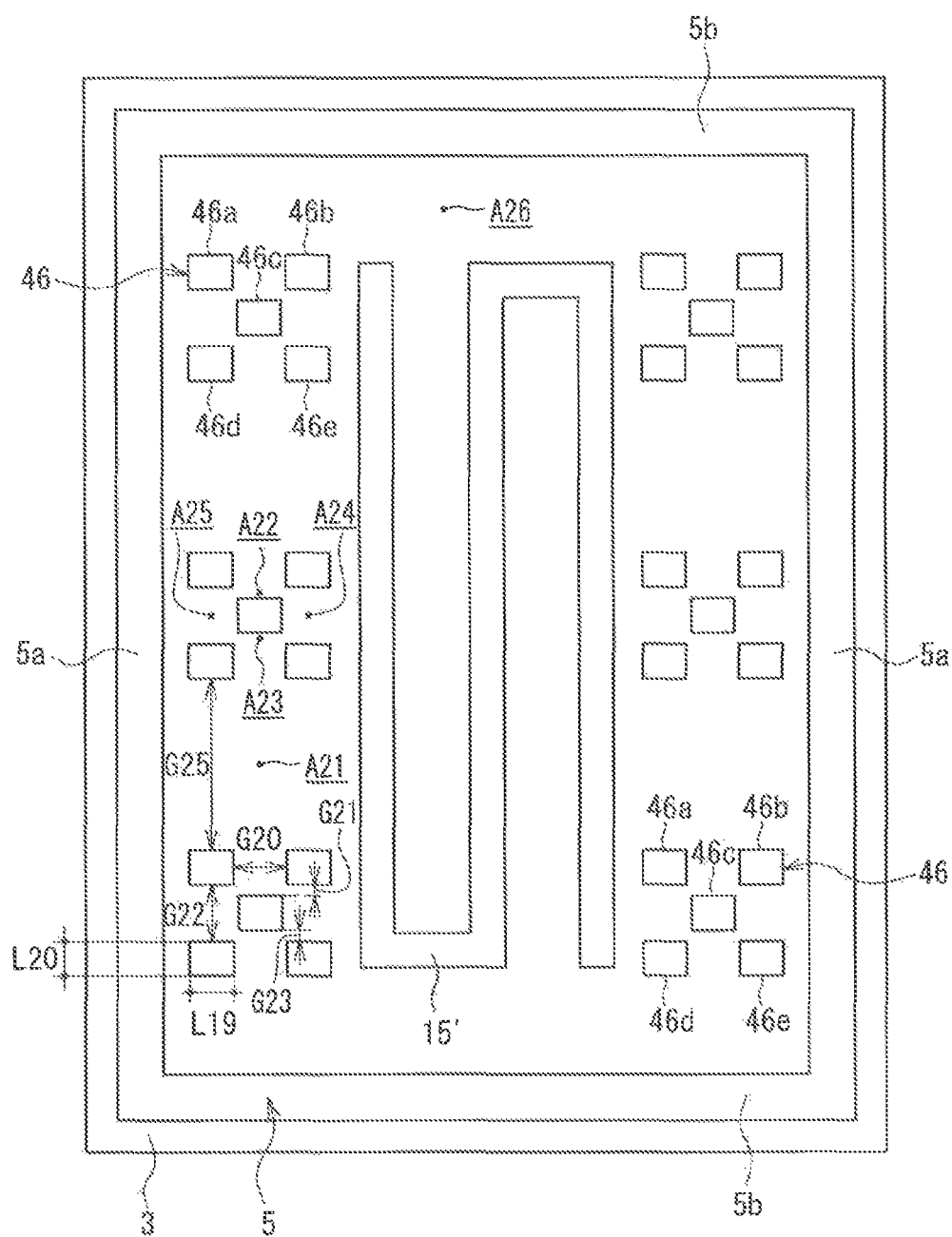
FIG. 9 is a plan view illustrating a sealing material, a filler, and a support that are provided on a counter substrate of an organic EL display device of Embodiment 5 of the present invention.

FIG. 9 is a plan view illustrating a sealing material, a filler, and a support that are provided on a counter substrate of an organic EL display device of Embodiment 5 of the present invention.

In FIG. 9, this embodiment mainly differs from Embodiment 1 in that a support includes a plurality of support members that are alternately arranged along a side of a frame-shaped sealing material. The same components as those of Embodiment 1 are denoted by the same reference numerals, and the explanation will not be repeated.

As illustrated in FIG. 9, an organic EL display device 1 of this embodiment includes a support 46 that is provided on a counter substrate 3 and located inside a frame-shaped sealing material 5. The support 46 includes three groups of support members that are provided along each of two long sides 5a of the frame-shaped sealing material 5. Each of the groups includes a plurality of, e.g., five support members 46a, 46b, 46c, 46d, and 46e that are arranged perpendicular to each of two long sides 5a of the frame-shaped sealing material 5. The support members 46a, 46b, 46c, 46d, and 46e have the same size.

In the support 46, the support members 46a, 46b, 46c, 46d, and 46e in each of the groups are alternately arranged along a long side 5a of the sealing material 5. As illustrated in FIG. 9, the support members 46a and 46b are arranged on a line extending perpendicular to the long side 5a, and the support member 46c is disposed between the support members 46a and 46b in the direction perpendicular to the long side 5a. Moreover, the support member 46c is disposed between the support members 46d and 46e that are arranged on a line extending perpendicular to the long side 5a. The support members 46a and 46d are at the same distance from the long side 5a in the direction perpendicular to the long side 5a. The support members 46b and 46e are at the same distance from the long side 5a in the direction perpendicular to the long side 5a.

The support members 46a, 46b, 46c, 46d, and 46e of the support 46 are made of the same material as that of e.g., the sealing material 5.

In the support 46, there is an aperture A21 (i.e., one of the holes) between two adjacent groups of support members. In each of the groups of support members, there is an aperture A22 (i.e., one of the holes) between the support members 46a, 46b, and 46c, and there is an aperture A23 (i.e., one of the holes) between the support members 46c, 46d, and 46e. Moreover, there is an aperture A24 (i.e., one of the holes) between the support members 46b, 46c, and 46e, and there is an aperture A25 (i.e., one of the holes) between the support member 46a, the support member 46d, and the long side 5a. Further, there is an aperture A26 between the left and right groups of support members (FIG. 9) on each of the short sides 5b.

The length (represented by "L19" in FIG. 9) of each of the support members 46a, 46b, 46c, 46d, and 46e in the direction perpendicular to the long side 5a is set to, e.g., about 3 mm, and the length (represented by "L20" in FIG. 9) of each the support members 46a, 46b, 46c, 46d, and 46e in the direction parallel to the long side 5a is set to, e.g., about 2 mm.

In the support 46, the gap (represented by "G20" in FIG. 9) between the support members 46a and 46b is set to, e.g., about 6 mm. Moreover, the gap (represented by "G21" in FIG. 9) between the support members 46b and 46c is set to, e.g., about 2 mm, the gap (represented by "G22" in FIG. 9) between the support members 46a and 46d is set to, e.g., about 6 mm, and the gap (represented by "G21" in FIG. 9) between the support members 46c and 46e is set to, e.g., about 2 mm. Further, the gap (represented by "G2" in FIG. 9) between the support member 46a and the long side 5a is set to, e.g., 2 mm or less, and the gap (represented by "G25" in FIG. 9) between two adjacent groups of support members is set to, e.g., about 22 mm.

With the above configuration, this embodiment can have the same effects as those of Embodiment 1. In this embodiment, the support 46 includes a plurality of supports members 46a, 46b, 46c, 46d, and 46e that are alternately arranged along each of the long sides 5a of the frame-shaped sealing material 5. Thus, in this embodiment, the filler 15' can easily spread, while the strength of supporting the TFT substrate 2 and the counter substrate 3 is ensured.

The above embodiments are all illustrative and not restrictive. The technical scope of the present invention is defined by the appended claims, and all changes that come within the range of equivalency of the claims are intended to be embraced therein.

For example, in the above description, the organic EL element is used as an electroluminescent element. However, the present invention is not limited thereto, and may use, e.g., an inorganic EL element including an inorganic compound.

In the above description, the support includes a plurality of support members. However, the present invention is not limited thereto, and may use any support that is located inside the sealing material and between the substrate and the counter substrate so as to leave holes through which the filler can flow, and that also supports the substrate and the counter substrate. Specifically, e.g., a frame-shaped support having wall portions may be provided inside the sealing material so that the wall portions are in contact with both the substrate and the counter substrate to hermetically seal the internal space, and a part of the wall portions of the support may have holes through which the filler can flow.

In the above description, the present invention is applied to the active matrix type organic EL display device including the TFTs (thin-film transistors) 7. However, the present invention is not limited thereto, and may be applied to a passive matrix type organic EL display device including no thin-film transistor.

In the above description, the present invention is applied to the bottom emission type organic EL display device. However, the present invention is not limited thereto, and may be applied to a top emission type organic EL display device in which the first electrode provided on the substrate is a reflecting electrode, and light from the organic EL element (electroluminescent element) is emitted from the counter substrate to the outside.

As described in each of the above embodiments, the bottom emission type organic EL display device is preferred because the support can be located on the effective display (light emitting) area of the organic EL element, and thus it is easy to narrow the frame of the organic EL display device.

In the above description, the present invention is applied to the organic EL display device. However, the present invention is not limited thereto, and may be applied to, e.g., an illuminating device such as a backlight device.

Other than the above description, Embodiments 1 to 5 may be combined as needed.

INDUSTRIAL APPLICABILITY

The present invention is useful for an electroluminescent device that has high reliability and allows a filler to be uniformly filled in the space between a substrate and a counter substrate even when the substrate and the counter substrate are bonded together.

DESCRIPTION OF REFERENCE NUMERALS

1 Organic EL display device (electroluminescent device)
2 TFT substrate (substrate)
3 Counter substrate
4 Organic EL element (electroluminescent element)
5 Sealing material
5a Long side
5b Short side
11 First electrode
13 Second electrode
14 Sealing film
15 Filling layer
15' Filler
16, 26, 36, 46 Support 16a, 26a, 26b, 36a, 36b, 36c, 36d, 36e, 46a, 46b, 46c, 46d, 46e Support member
A1 to A26 Aperture (hole)

The invention claimed is:

1. An electroluminescent device comprising:
a substrate;
an electroluminescent element provided on the substrate;
a counter substrate that is located opposite the substrate;
a sealing film that seals the electroluminescent element;
a frame-shaped sealing material that is provided between the substrate and the counter substrate, and that is configured to seal the electroluminescent element along with the substrate and the counter substrate; and
a filling layer that is composed of a liquid filler, and that is filled in a space between the counter substrate, the sealing film, and the frame-shaped sealing material, and
wherein a support is located inside the sealing material and between the substrate and the counter substrate so as to leave holes through which the filler can flow, and also supports the substrate and the counter substrate.

2. The electroluminescent device according to claim 1, wherein the support includes a plurality of support members that are arranged parallel to a side of the frame-shaped sealing material.

3. The electroluminescent device according to claim 1, wherein the support includes a plurality of support members that are arranged perpendicular to a side of the frame-shaped sealing material.

4. The electroluminescent device according to claim 1, wherein the support includes a plurality of support members that are arranged only along long sides of four sides of the frame-shaped sealing material.

5. The electroluminescent device according to claim 1, wherein the support is configured such that a size of a support member located in an end portion of a side of the framed-shaped sealing material is larger than that of a support member located in a central portion of the side of the frame-shaped sealing material.

6. The electroluminescent device according to claim 1, wherein the support includes a plurality of support members that are alternately arranged along a side of the frame-shaped sealing material.

7. The electroluminescent device according to claim 1, wherein the electroluminescent element includes a first electrode provided on the substrate and a second electrode provided on the counter substrate,
the second electrode is a reflecting electrode and light from the electroluminescent element is emitted from the substrate to the outside.

8. The electroluminescent device according to claim 1, wherein the support is made of the same material as that of the sealing material.

* * * * *